United States Patent [19]

Pfändler

[11] Patent Number: 5,029,268

[45] Date of Patent: Jul. 2, 1991

[54] CIRCUIT ARRANGEMENT FOR SELF-EXCITATION OF A MECHANICAL OSCILLATION SYSTEM TO NATURAL RESONANT OSCILLATIONS

[75] Inventor: Martin Pfändler, Steinen, Fed. Rep. of Germany

[73] Assignee: Endress u. Hauser GmbH u. Co., Fed. Rep. of Germany

[21] Appl. No.: 455,417

[22] PCT Filed: May 3, 1989

[86] PCT No.: PCT DE89/00281

§ 371 Date: Dec. 27, 1989

§ 102(e) Date: Dec. 27, 1989

[87] PCT Pub. No.: WO89/10802

PCT Pub. Date: Nov. 16, 1989

[30] Foreign Application Priority Data

May 3, 1988 [DE] Fed. Rep. of Germany ....... 3815007

[51] Int. Cl.[5] ............................................ H03B 5/32

[52] U.S. Cl. ...................................... 331/158; 331/65

[58] Field of Search ................. 331/154, 158, 167, 65; 324/71.1, 123 R, 139, 147

[56] References Cited

U.S. PATENT DOCUMENTS

| | | | |
|---|---|---|---|
| 3,469,211 | 9/1969 | Shoh et al. | 331/116 |
| 4,734,659 | 3/1988 | Tanaka et al. | 331/158 X |

FOREIGN PATENT DOCUMENTS

| | | |
|---|---|---|
| 3111109 | 9/1982 | Fed. Rep. of Germany . |
| 0845267 | 8/1960 | United Kingdom . |

OTHER PUBLICATIONS

Crump, "Diode Function Generators", *Wireless World*, Band 73, No. 12, Dec. 1987, pp. 594–598.

Patent Abstracts of Japan, Band 8, No. 163.

U. Tietze et al., "Halbleiter-Schaltungstechnik", Springer-Verlag, 1983, pp. 137–139, 440–442, and 453–458.

*Primary Examiner*—Robert J. Pascal

*Attorney, Agent, or Firm*—Barnes & Thornburg

[57] ABSTRACT

The circuit arrangement for self-excitation of a mechanical oscillation system to natural resonant oscillations includes an electromechanical transducer system which is arranged in the feedback circuit of an electronic amplifier circuit so that it is stimulated by the output AC voltage of the amplifier circuit to mechanical oscillations and furnishes an AC voltage with the frequency of the mechanical oscillations to the input of the amplifier circuit. The amplifier circuit has a non-linear gain characteristic which at small values of the input signal gives a greater amplification than at lower values of the input signal. As a result a reliable oscillation start is ensured even under unfavorable operating conditions while on the other hand the danger of erroneous indications of the oscillation state, for example due to external vibrations, is reduced.

6 Claims, 4 Drawing Sheets

Figure 1:
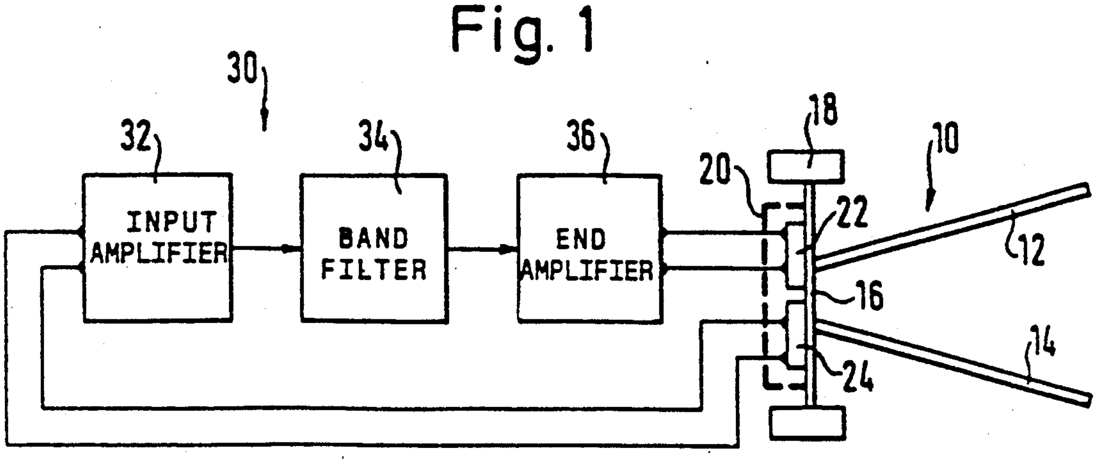

CIRCUIT ARRANGEMENT FOR SELF-EXCITATION OF A MECHANICAL OSCILLATION SYSTEM TO NATURAL RESONANT OSCILLATIONS

The invention relates to a circuit arrangement for self-excitation of a mechanical oscillation system to natural resonant oscillations comprising an electromechanical transducer system which is arranged in the feedback circuit of an electronic amplifier circuit so that said system is stimulated by the output AC voltage of the amplifier circuit to mechanical oscillations and furnishes an AC voltage with the frequency of the mechanical oscillations to the input of the amplifier circuit.

In various fields of use of mechanical oscillations this known type of self-excitation of natural resonant oscillations presents problems. This is for example true for mechanical oscillation systems with oscillating rods which are used as sensors for detecting when a predetermined filling level in a container is reached, employing the fact that the oscillations on immersion of the sensor into the filling material stop because of the strong damping whilst the restarting of the oscillations indicates that the filling level has dropped below the installation level of the sensor. If in such a use the sensor is exposed in the process container to high temperatures then this can change the transmission factor of the sensor to such an extent that it can no longer start oscillating and as a result an erroneous indication of the filling level is given. Filling materials (e.g. lime, flour) with a pronounced tendency to form encrustations or deposits have the same effect: with pronounced encrustation the sensor can no longer start vibrating so that it is erroneously indicated that the sensor is covered although in reality it is not immersed in the filling material and only covered with the encrustation or the like.

If the gain of the amplifier circuit is increased to avoid the problems outlined above the external vibration sensitivity becomes too large. This means that when the sensor is covered vibrations at the container caused for example by agitators or filling material flowing past can produce output voltages of the amplifier circuit which simulate the sensor not being covered and lead to natural resonant oscillations, then erroneously indicating too low a filling level.

The problem underlying the invention is the provision of a circuit arrangement for self-excitation of a mechanical vibration or oscillation system which with small circuit expenditure ensures reliable buildup of oscillations even under unfavorable operating conditions and reduces the risk of erroneous indications of the oscillation state.

According to the invention this problem is solved in that the amplifier circuit has a non-linear gain characteristic which at small values of the input signal gives a greater gain than at larger values of the input signal The circuit arrangement constructed according to the invention has a high response sensitivity at small values of the input signal of the amplifier circuit so that even by weak interfering effects, for example slight external vibrations, thermal noise or similar interference effects, oscillation is initiated which rapidly builds up. In contrast, at higher values of the input signal the input sensitivity is reduced so that a good insensitivity to external vibrations is achieved. For example, when the circuit arrangement is used in a filling level sensor of the type outlined above said sensor has a very good starting behavior in a large temperature range and a very good encrustation compatibility with simultaneous high insensitivity to foreign or external vibrations.

The necessary non-linear gain characteristic can be achieved with small circuit expenditure because all that is needed is a two-stage amplification which changes from a large value to a smaller value when the magnitude of the input signal exceeds a predetermined threshold value.

Advantageous embodiments and further developments of the invention are characterized in the subsidiary claims.

Figure 2:
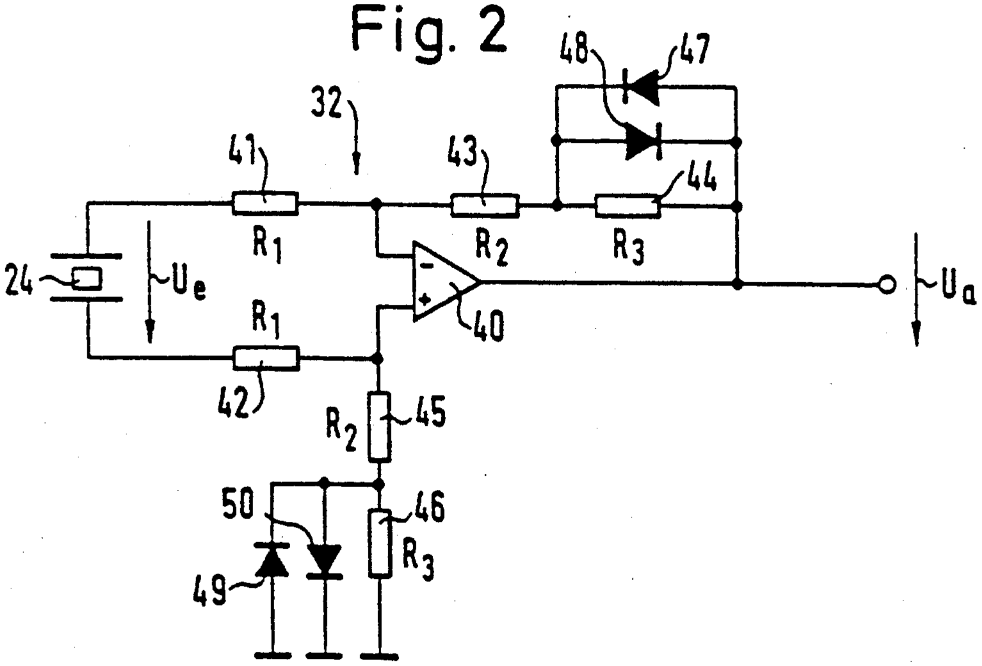
Figure 3A:
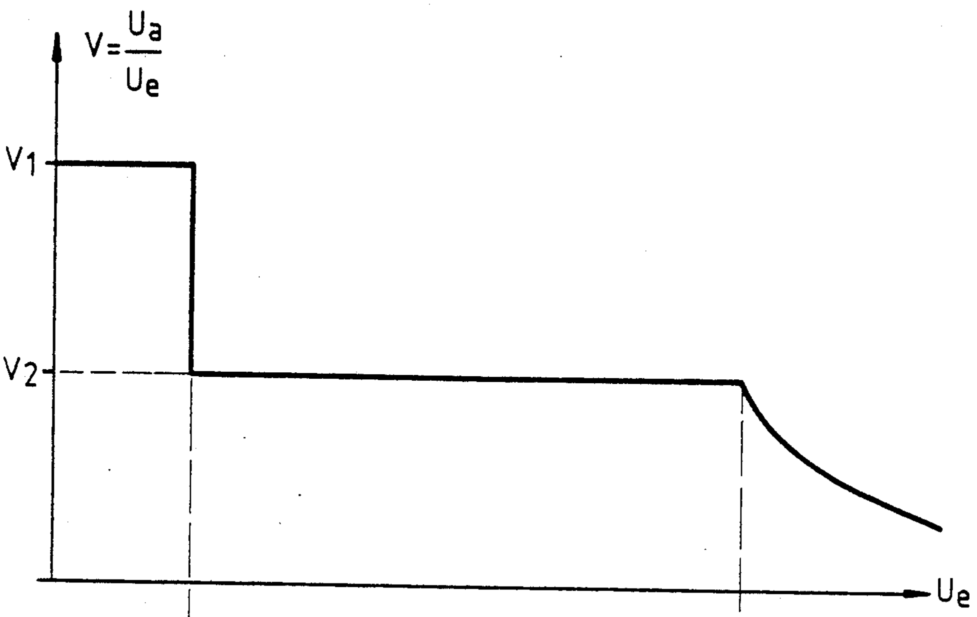
Figure 3B:
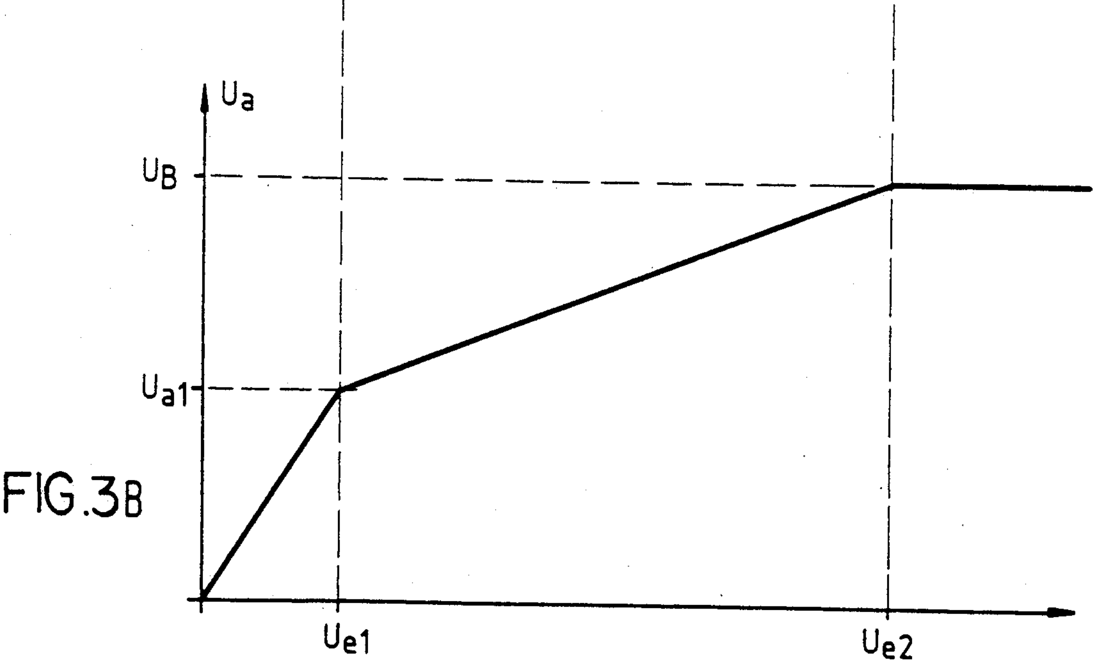
Figure 4:
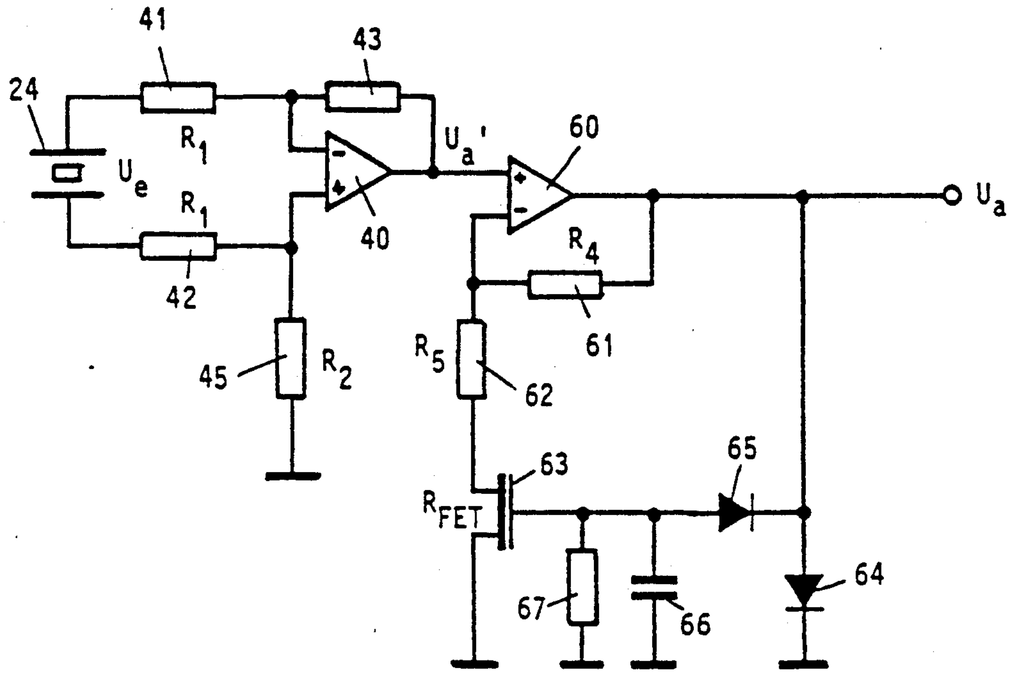
Figure 5A:
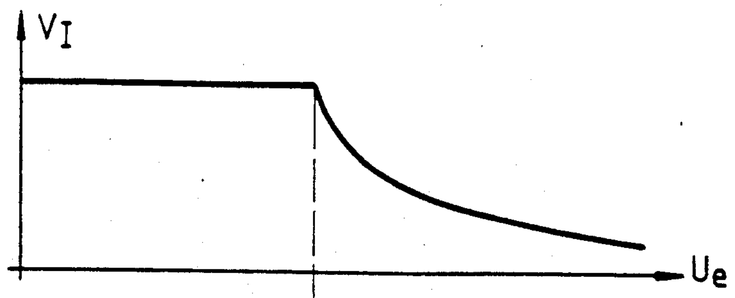
Figure 5B:
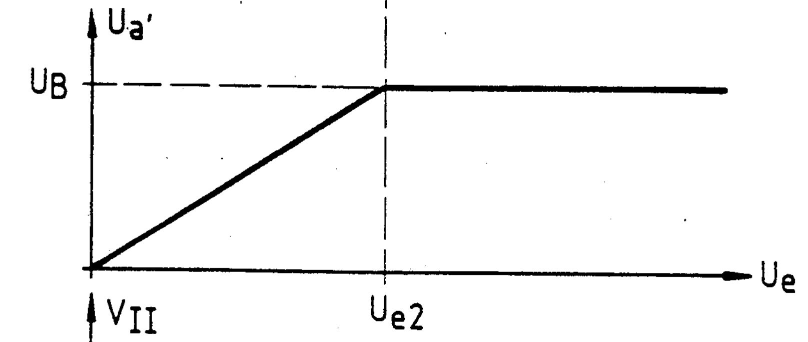
Figure 5C:
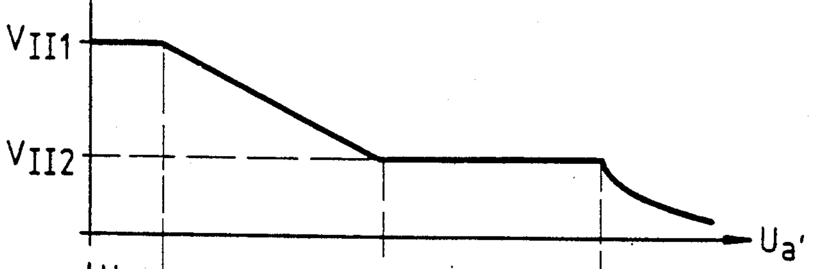
Figure 5D:
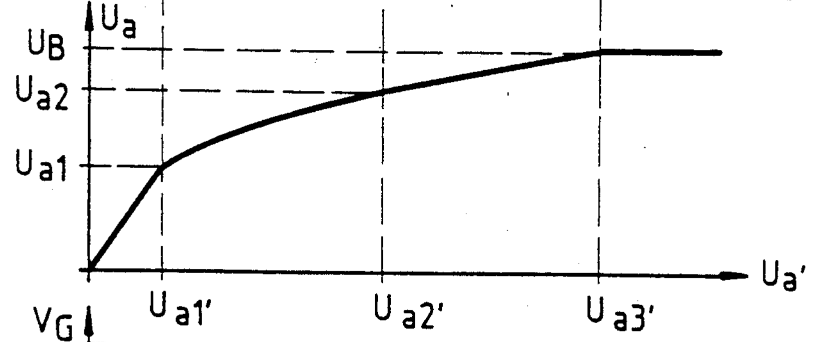
Figure 5E:
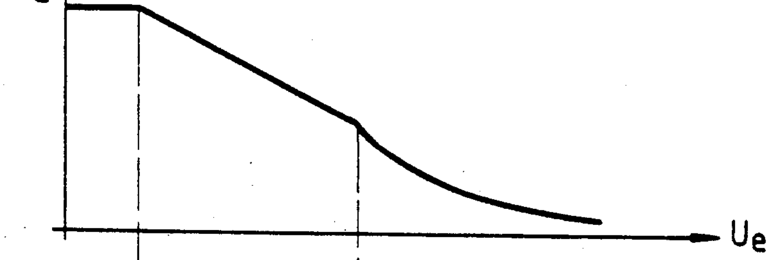
Figure 5F:
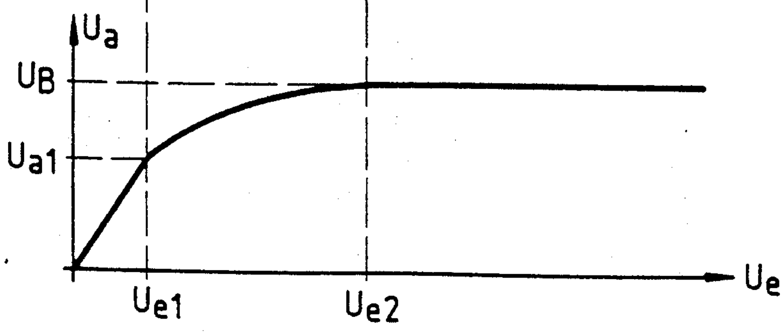

Further features and advantages of the invention will be apparent from the following description of an example of embodiment which is illustrated in the drawings, wherein:

FIG. 1 is the block circuit diagram of the circuit arrangement for excitation of a mechanical oscillation system to natural resonant oscillations, FIG. 2 is the circuit diagram of an embodiment of the input amplifier of the circuit arrangement of FIG. 1, FIG. 3 shows diagrams to explain the mode of operation of the input amplifier of FIG. 2, FIG. 4 is the circuit diagram of another embodiment of the input amplifier of FIG. 2 and FIG. 5 shows diagrams explaining the mode of operation of the input amplifier of FIG. 4.

As an example of a mechanical oscillation system which is to be stimulated to oscillations with natural resonant frequency FIG. 1 shows a filling level sensor 10 comprising two oscillating bars or rods 12, 14. The oscillating rods are set in opposite phase flexural oscillations which when the rods are immersed in the filling material are dampened to such an extent that the oscillations stop making it possible to detect that the filling material has reached a predetermined level, whereas conversely restarting of the oscillations shows that the filling level has again dropped below the level to be monitored. The oscillating rods 12, 14 are each secured with one end to a diaphragm 16 clamped at the edge in a holder 18.

For generating the natural resonant oscillations of the mechanical oscillation system 10 an electromechanical transducer system 20 is connected to the diaphragm 16 and comprises a transmitting transducer 22 and a receiving transducer 24. The transmitting transducer 22 is connected to the output of an amplifier circuit 30 and is so constructed that it converts electrical AC voltage (or an electrical alternating current) furnished by the amplifier circuit 30 to a mechanical oscillation which is transmitted to the diaphragm 16 and to the oscillating rods 12, 14. The receiving transducer 24 is connected to the input of the amplifier circuit 30 and is so constructed that it converts the mechanical oscillation of the oscillation system 10 to an electrical AC voltage of the same frequency. This input AC voltage is amplified by the amplifier circuit and the amplified output AC voltage thus obtained and having the same frequency is applied to the transmitting transducer 22. It is readily apparent that the mechanical oscillation system in this manner lies in a self-exciting feedback circuit of the amplifier circuit 30 in which it forms the frequency-governing member so that it is stimulated to oscillations with its natural resonant frequency.

The electromechanical transducers 22, 24 may be of any type known per se, for example electromagnetic or electrodynamic transducers with coils, magnetostrictive transducers, piezoelectric transducers or the like. In the example of embodiment described it is assumed that piezoelectric transducers are involved which in known manner contain a piezocrystal disposed between two electrodes which undergoes a change of shape when an electrical voltage is applied to the two electrodes and which conversely under a mechanically forced change of shape generates an electrical voltage between the two electrodes. The transmitting transducer 22 and the receiving transducer 24 may therefore be of the same design.

The amplifier circuit 30 includes an input amplifier 32 of which the input terminals are connected to the two electrodes of the receiving transducer 24, a band filter 34 connected to the output of the input amplifier 32 and an end amplifier 36 to the output terminals of which the two electrodes of the transmitting transducer 22 are connected. The band filter 34 is tuned to the natural resonant frequency of the electromechanical oscillation system 10 to be excited so that the electrical AC voltage is selectively amplified with this frequency. The frequency may be that of the fundamental mode or that of a harmonic of the natural resonance of the mechanical oscillation system 10.

The peculiarity of the amplifier circuit 30 resides in that its gain characteristic in dependence upon the magnitude of the input signal is non-linear in such a manner that the gain at small amplitudes of the input signal is greater than at large amplitudes. In the example of embodiment illustrated this non-linear gain characteristic of the amplifier circuit 30 is achieved in that the input amplifier 32 is made with non-linear gain.

FIG. 2 shows an embodiment of the input amplifier 32 which with particularly simple means gives the desired non-linear gain characteristic. The input amplifier 32 is constructed as differential amplifier comprising an operational amplifier 40. The two inputs of the operational amplifier 40 are connected via identical resistors 41, 42 of the same resistance value $R_1$ to the two electrodes of the receiving transducer 24 so that the voltage between said electrodes forms the input voltage $U_e$ of the differential amplifier. In the feedback branch of the operational amplifier 40 leading from the output to the inverting input two resistors 43, 44 with the resistance values $R_2$ and $R_3$ respectively are connected in series and two further resistors 45, 46 with the same resistance values $R_2$ and $R_3$ are connected in series between the non-inverting input of the operational amplifier 40 and ground. Two semiconductor diodes 47, 48 are connected in parallel in opposite senses with the resistor 44 and in corresponding manner two further semiconductor diodes 49, 50 are connected in parallel in opposite senses to the resistor 46.

The differential amplifier illustrated in FIG. 2 gives the following mode of operation:

When the mechanical oscillation system 10 is at rest on switching on the apparatus the receiving transducer 24 initially furnishes only very small voltages which are caused by slight external vibrations, thermal noise and similar interference effects. These small voltages are amplified by the differential input amplifier 32. As long as the output voltage $U_a$ of the differential input amplifier thus generated is so small that the voltage drops across the resistors 44 and 46 are smaller than the forward voltage of the semiconductor diodes 47, 48, 49, 50 (which in silicone diodes is about 0.6 V) the semiconductor diodes become nonconductive in both directions and the resistors 44 and 46 are fully effective. For such small input signals the gain factor V of the differential input amplifier 32 is $$V_1 = 1 + \frac{R_2 + R_3}{R_1} \qquad (1)$$

Those components of the output voltage $U_a$ having frequencies in the pass range of the band filter 34 reach the end amplifier 36 by which they are further amplified with linear gain. The signal components thus amplified are converted by the transmitting transducer 22 to mechanical oscillations which stimulate the mechanical oscillation system 10 to a natural resonant oscillation. This natural resonant oscillation is converted by the receiving transducer 24 to an electrical AC voltage which is applied to the input of the differential input amplifier 32 and amplified by the latter in the manner described above. In this manner the oscillations of the mechanical oscillation system 10 build up.

If during this oscillation start the voltage $U_a$ at the output of the differential input amplifier 32 becomes so large that the voltage drops at the resistors 44 and 46 become larger than the forward voltage of the semiconductor diodes 47, 48 and 49, 50 respectively, the semiconductor diodes become conductive and therefore short circuit the resistors 44 and 46. The gain factor V of the differential input amplifier 32 is then $$V_2 = 1 + \frac{R_2}{R_1} \qquad (2)$$

Diagram A of FIG. 3 shows this dependence of the gain factor V on the voltage and diagram B of FIG. 3 shows the resulting relationship between the input voltage $U_e$ and the output voltage $U_a$ of the input differential amplifier 32. At values of the input voltage $U_e$ which are smaller than a value $U_{el}$ the output voltage $U_a$ is defined by the constant gain factor $V_1$ so that it is proportional with relatively great steepness to the input voltage $U_e$ In this range the amplifier circuit 30 has a high input sensitivity so that even in the presence of weak interference effects and on temperature induced changes of the transmission factor and encrustations on the oscillating rods 12, 14 a reliable oscillation start is ensured.

At the value $U_{el}$ of the input voltage $U_e$ the output voltage $U_a$, due to the amplification with the gain factor $V_1$, reaches a value $U_{a1}$ which is equal to the forward voltage of the semiconductor diodes 47, 48, 49, 50. At values of the input voltage $U_e$ which are greater than the value $U_{e1}$ the gain factor V thus has the smaller value $V_2$ so that the output voltage $U_a$ rises less steeply in dependence upon the input voltage $U_e$. In this range, in which no oscillation starting problems arise, the input sensitivity of the gain circuit is thus reduced so that voltages which are generated by interference vibrations cannot reach values which simulate a resonant oscillation of the mechanical oscillation system 10. Finally, if the input voltage $U_e$ reaches a value $U_{e2}$ at which the output voltage $U_a$ has the highest value $U_B$ defined by the current supply voltage, the input amplifier 32 becomes saturated so that a further rise of the input voltage $U_e$ does not result in any further increase in the output voltage $U_a$.

The effects outlined are achieved with very little additional circuit expenditure. Compared with a differential input amplifier with linear amplification the additional expenditure is restricted to the two resistors 44, 46 and the four semiconductor diodes 47, 48, 49, 50.

FIG. 4 shows another embodiment of the input amplifier 32 which also gives the desired non-linear amplification characteristic. In this embodiment the input amplifier 32 consists of two amplifier stages The first amplifier stage corresponds to the input amplifier of FIG. 2 with the sole difference that the resistors 44 and 46 and the semiconductor diodes 47, 48 and 49, 50 respectively connected in parallel in opposite senses thereto are omitted. The remaining components of this amplifier stage, which correspond to those of the input amplifier of FIG. 2, are denoted by the same reference numerals as in FIG. 2. As in FIG. 2, the two electrodes of the receiving transducer 24 are connected via identical resistors 41, 42 with the resistance value $R_1$ to the two inputs of the operational amplifier 40 so that the voltage between said electrodes forms the input voltage $U_e$ of the differential amplifier Since now in the feedback circuit of the operational amplifier 40 and in the circuit branch leading from the non-inverting input to ground only the invariable resistors 43 and 45 of the resistance value $R_2$ are disposed, this amplifier stage has the constant gain factor $$V_I = 1 + \frac{R_2}{R_1} \quad (3)$$

Thus, at the output of the operational amplifier 40 the voltage $$U_a' = U_e \cdot V_I \quad (4)$$

is delivered.

The second amplifier stage includes an operational amplifier 60 of which the non-inverting input is connected to the output of the first amplifier stage so that the output voltage $U_a'$ of the first amplifier stage forms the input voltage of the second amplifier stage, the output voltage $U_a$ of which represents at the same time the output voltage of the input amplifier 32. A resistor 61 having the resistance value $R_4$ lies in the feedback circuit of the operational amplifier 60 leading to the inverting input. Furthermore, between the inverting input of the operational amplifier 60 and ground there is a circuit branch which contains a resistor 62 with the resistance value $R_5$ in series with the current path of a field-effect transistor 63. The resistance $R_{FET}$ of the field-effect transistor 63 depends on the control voltage applied to the gate electrode thereof. Said control voltage is derived from the output voltage $U_a$ by rectification by means of a rectifier circuit containing two semiconductor diodes 64, 65 and a smoothing circuit having a capacitor 66 parallel to a resistor 67. Thus, the current path resistance $R_{FET}$ of the field-effect transistor 63 depends on the amplitude of the output voltage $U_a$. This gives for the second amplifier stage the gain factor $$V_{II} = 1 + \frac{R_4}{R_5 + R_{FET}} \quad (5)$$

which is variable in dependence upon the resistance $R_{FET}$ and thus in dependence upon the output voltage $U_a$.

The gain factor $V_{II}$ governs the relationship between the input voltage $U_a'$ and the output voltage $U_a$ of the second amplifier stage $$U_a = U_a' \cdot V_{II} \quad (6)$$

The input amplifier 32 consisting of the two amplifier stages has the total gain $V_G$ $$V_G = V_I \cdot V_{II} \quad (7)$$

so that between the input voltage $U_e$ and the output voltage $U_a$ of the input amplifier 32 the following relationship applies:

$$U_a = U_e \cdot V_G \quad (8)$$

The relationships between the gain factors $V_I$, $V_{II}$, $V_G$ and the voltages $U_e$, $U_a'$, $U_a$ are represented in the diagrams of FIG. 5.

In FIG. 5 the diagram A shows the voltage-dependent variation of the gain factor $V_I$ and the diagram B the resulting relationship between the input voltage $U_e$ and the output voltage $U_a'$ of the first amplifier stage. Up to a value $U_{e2}$ of the input voltage at which the output voltage $U_a'$ reaches the saturation value $U_B$ the gain factor $V_1$ is constant so that the voltage $U_a'$ is proportional to the input voltage $U_e$.

The diagrams C and D show correspondingly the conditions for the second amplifier stage. Up to a value $U_{a1}'$ of the $U_a$II the gain factor V has a relatively large constant value $V_{II1}$ so that the output voltage $U_a$ is proportional to the voltage $U_a'$ with relatively great steepness. Between the values $U_{a1}'$ and $U_{a2}'$ the input voltage $U_a'$ or the corresponding values $U_{a1}$ and $U_{a2}$ of the output voltage $U_a$ is the change range of the resistance $R_{FET}$; accordingly, the gain factor $V_{II}$ drops in this range from the value $V_{II1}$ to a lower value $V_{II2}$, resulting in this range in the non-linear relationship represented in diagram D between the voltages $U_a'$ and $U_a$ Between the voltage value $U_{a2}'$ and a voltage value $U_{a3}'$ at which the output voltage $U_a$ reaches the saturation value $U_B$ the resistance $R_{FET}$ no longer changes so that in this range the gain factor $V_{II}$ retains the constant lower value $V_{II2}$ and the voltage $U_a$ is again proportional to the voltage $U_a'$ but with substantially less steepness.

Finally, the diagram E shows the total gain factor $V_G$ of the input amplifier 32 which is given by the product of the two gain factors $V_I$ and $V_{II}$, and diagram F shows the corresponding relationship between the input voltage $U_e$ and the output voltage $U_a$. It is immediately apparent that the diagram F of FIG. 5 is very similar to the diagram B of FIG. 3. In particular, in the embodiment of FIG. 4 as well the input amplifier at small values of the input voltage $U_e$ has a large gain factor and consequently high input sensitivity whilst at higher values of the input voltage the gain factor is smaller and consequently the input sensitivity reduced. The embodiment of FIG. 4 therefore gives the same advantageous effects as explained above for the embodiment of FIG. 2.

I claim:

1. Circuit arrangement for self-excitation of natural resonant oscillations of the mechanical oscillation system of a filling level sensor comprising an electromechanical transducer system which is arranged in the feedback circuit of an electronic amplifier circuit so that said system is stimulated by the output AC voltage of the amplifier circuit to mechanical oscillations and furnishes an AC voltage with the frequency of the mechanical oscillations to the input of the amplifier circuit, characterized in that the amplifier circuit (30) comprises an amplifier stage (32) with non-linear gain characteristic which is formed by an operational amplifier (40) of which the feedback resistance is variable in dependence upon the signal amplitude in such a manner that at small values of the input signal a greater gain results than at larger values of the input signal and wherein the feedback circuit of the operational amplifier (40) contains two resistors ($R_2$, $R_3$) connected in series and that with one of the two resistors two semiconductor diodes (47, 48) are connected in parallel in opposite senses.

2. Circuit arrangement according to claim 1, characterized in that the operational amplifier (40) is formed as differential amplifier with two additional resistors (45, 46) connected in series between the non-inverting input and ground and that two semiconductor diodes (49, 50) are connected in parallel in opposite senses with one of the additional resistors (46).

3. A circuit arrangement for self-excitation of natural resonant oscillations of a mechanical oscillation system of a filing level sensor comprising an electromechanical transducer system which is arranged in a feedback circuit of an amplifier circuit so that said system is stimulated by an output AC voltage of the amplifier circuit to mechanical oscillations and furnishes an AV voltage having a frequency of the mechanical oscillations to an input of the amplifier circuit, characterized in that the amplifier circuit comprises an amplifier stage having a non-linear gain characteristic which is formed by an operational amplifier of which the feedback resistance is variable in dependence upon the signal amplitude in such a manner that at small values of the input signal a greater gain results than at larger values of the input signal and wherein an inverting input of the operational amplifier is connected to group via a circuit branch containing a field-effect transistor and that the current flow resistance of the field-effect transistor is variable by a control voltage which is applied to the gate electrode thereof and which depends upon the outlet voltage of the operational amplifier.

4. Circuit arrangement according to claim 3, characterized in that the control voltage is formed from the output voltage by rectification.

5. A circuit arrangement for the self-excitation of natural resonant oscillations of a mechanical oscillation system of a filling level sensor comprising an electromechanical transducer system and an electronic amplifier circuit which are arranged in a feedback loop so that said electromechanical transducer system is stimulated to mechanical oscillations by an output AC voltage of said amplifier circuit and furnishes an AC voltage having a frequency of the mechanical oscillations to an input of said amplifier circuit, wherein said amplifier circuit comprises an amplifier stage formed by an operational amplifier having a feedback circuit coupled between its output and its inverting input, said feedback circuit including two resistors coupled in series and two semiconductor diodes coupled in opposite senses in parallel to each other and to one of said two resistors.

6. Circuit arrangement as claimed in claim 5 wherein two further resistors are coupled in series between the non-inverting input of said operational amplifier and ground, and two further semiconductor diodes are coupled in opposite senses in parallel to each other and to one f said further two resistors.

* * * * *